US008758027B1

(12) United States Patent
Landa et al.

(10) Patent No.: US 8,758,027 B1
(45) Date of Patent: Jun. 24, 2014

(54) INTEGRATED CIRCUIT (IC) SOCKET WITH CONTOURED CAPTURE GROOVE

(71) Applicant: Titan Semiconductor Tool, LLC, Ladera Ranch, CA (US)

(72) Inventors: Victor Landa, Ladera Ranch, CA (US); Pongsak Tiengtum, Ladera Ranch, CA (US)

(73) Assignee: Titan Semiconductor Tool, LLC, Ladera Ranch, CA (US)

( * ) Notice: Subject to any disclaimer, the term of this patent is extended or adjusted under 35 U.S.C. 154(b) by 24 days.

(21) Appl. No.: 13/769,120

(22) Filed: Feb. 15, 2013

(51) Int. Cl.
*H01R 12/00* (2006.01)
*H01R 12/51* (2011.01)

(52) U.S. Cl.
CPC ..................... *H01R 12/51* (2013.01)
USPC ............................................ 439/66

(58) Field of Classification Search
USPC ............. 439/81, 66–67, 70–73, 91, 492–493, 439/331
See application file for complete search history.

(56) References Cited

U.S. PATENT DOCUMENTS

| 4,515,425 | A | * | 5/1985 | Nakano | 439/73 |
| 4,969,828 | A | * | 11/1990 | Bright et al. | 439/68 |
| 6,409,521 | B1 | * | 6/2002 | Rathburn | 439/66 |
| 7,737,708 | B2 | | 6/2010 | Sherry | |
| 7,918,669 | B1 | * | 4/2011 | Tiengtum | 439/66 |

* cited by examiner

*Primary Examiner* — Jean F Duverne
(74) *Attorney, Agent, or Firm* — Fulwider Patton LLP

(57) ABSTRACT

An improved test socket for testing or connecting an integrated circuit is disclosed having a platform for receiving the integrated circuit and adapted to overlay a piece of test equipment or other board, the platform formed with an array of slots each locating a portion of a two-piece connector assembly. The socket includes a conforming groove that captures an elastomer member therein while providing exposure of the elastomer member to a link assembly. The socket, with the capture groove, provides improved contact of the link assembly and reliability in locating and maintaining positioning of the elastomer member.

4 Claims, 4 Drawing Sheets

US 8,758,027 B1

INTEGRATED CIRCUIT (IC) SOCKET WITH CONTOURED CAPTURE GROOVE

BACKGROUND

The present invention relates to a socket that electrically connects an integrated circuit with an IC board. More particularly, the present invention is directed to a socket, such as those used for testing or connecting an integrated circuit, that incorporates an array of two-piece connectors that achieve a positive connection between an IC device under test (DUT) and a board, such as a load board of a piece of test equipment or other fixture.

Integrated circuit tester devices have long been used in the semiconductor industry to test and evaluate the quality of the chips off the manufacturing line. Signal integrity is a critical aspect of chip design and testing. To this end, it is desirable to maintain impedance through a conducting portion of a contact interconnecting the integrated circuit lead to its corresponding load board pad at a particular desired level. The effective impedance of the design is a function of a number of factors. These include width and length of conduction path, material of which the conductive structure is made, material thickness, etc.

When testing the electrical characteristics of a packaged or molded semiconductor device such as an integrated circuit (IC), it is common to utilize a specialized test socket that secures and connects the IC to the equipment that evaluates its performance, i.e. a load board. Many different test sockets have been devised for quickly and temporarily connecting integrated circuit leads of a chip to be tested to a load board of a tester. Automated test apparatus in particular use a number of such sockets. Typical socket arrangements use force brought to bear upon a contact positioned between a lead of the IC and the load board to deform a probe tip of the contact and engage a pad on the load board. Such a configuration provides for positive connection between the pins or contact pads of the DUT and corresponding leads of a test apparatus. Examples of this type of connection can be found, for example, in U.S. Pat. No. 6,409,521 to Rathburn, and U.S. Pat. No. 7,737,708 to Sherry, the teachings and contents of both of which are fully incorporated herein by reference.

U.S. Pat. No. 7,918,669 to Tiengtum discloses a socket system that uses a linkage to urge the connectors of the test circuit upward where it can make contact with the test equipment. This test socket was found to be very successful in ensuring good contact with the test apparatus while reducing force on the circuit itself. However, the configuration shown in the '669 patent did not adequately secure the link member or properly direct its force against the PCB. The elastomer member could slip out of its groove or twist out of alignment. The present invention utilizes the benefits of the '669 socket but overcomes the shortcomings set forth above.

SUMMARY OF THE INVENTION

The present invention is a socket for an integrated circuit having a series of contact pads or other electrical connection sites linearly arranged, for example, along at least one peripheral edge, the socket including a platform that supports the IC and houses a plurality of connectors that when engaged with the integrated circuit's contact pads, complete an electrical connection between the contact pads and the associated fixture's contacts below the platform. The socket's platform may have a plurality of generally parallel slots for aligning and receiving a corresponding plurality of electrical contacts, one in each slot. Each electrical contact path is formed of a two piece linkage that cooperates to form an electrical connection between the contact pad and the fixture's contact. The two pieces of the contact cooperate together to form a non-deforming, reliable electrical connection between the IC and the board. The socket includes a semi-circular groove to house a cylindrical elastomer member, the profile providing both lateral, upward, and downward support to resist movement of the elastomer member and better position the connector against the PCB.

These and many other features of the present invention will best be understood by reference to the following descriptions and figures. However, it is to be understood that while the inventor's best mode has been described and shown, the invention is not to be limited to any particular drawing or description. Rather, it is understood that there may be many variations of the present invention that would be readily appreciated by one of ordinary skill in the art, and the invention encompasses all such variations and modifications.

DETAILED DESCRIPTION OF THE PREFERRED EMBODIMENTS

The description below is presented in the environment of a test board and a test IC. However, it is to be understood that the invention is not so limited in application, and that other uses of the socket are anticipated and contemplated by the inventors. Thus, no limitation should be implied by the use of terms such as "test socket" or "load board." Rather, the invention may be used for any and all applications for which it is appropriate.

Figure 1:
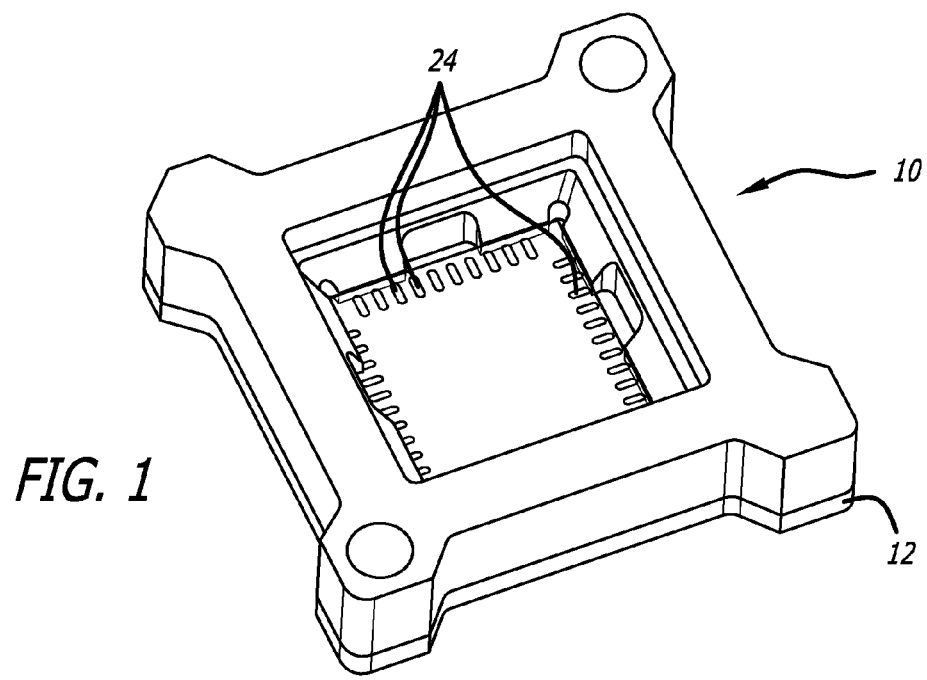
FIG. 1 is an elevated, perspective view of an embodiment of the test socket of the present invention.

FIG. 1 shows a test socket 10 of the type embodying the present invention having a generally square wall structure defining a well for receiving an integrated circuit component 16. As shown more effectively in FIG. 3, the test socket 10 has a platform 12 that receives the integrated circuit 16 thereon. The socket 10 is shown on a pad 18 that represents a piece of test equipment that can receive electrical signals from the IC 16 and assess the quality, strength, and other characteristics of the signal. The purpose of the test socket 10 is to electrically pass signals from the contact pad 20 of the IC 16 to the test equipment 18 via a connector assembly 22. The connector assembly 22 pivots between a stand-by or disengaged position where no IC is present, and an engaged position (FIG. 6), where the engaged position corresponds to the completed electrical circuit between the IC and the test equipment through the connector 22. The platform 12 has a plurality of slots 24 (best shown in FIG. 2) that allow a portion 19 of the connector 22 to emerge from an upper surface. As explained below, when the IC 16 is placed on the platform 12, the pads 20 of the IC 16 each contact a portion 19 of the connectors 22 protruding through the slots 24, and cause the connectors 22 to pivot into the engaged position. In this way, the electrical contact is established reliably and automatically when the IC is placed on the test socket platform 12.

Figure 6:
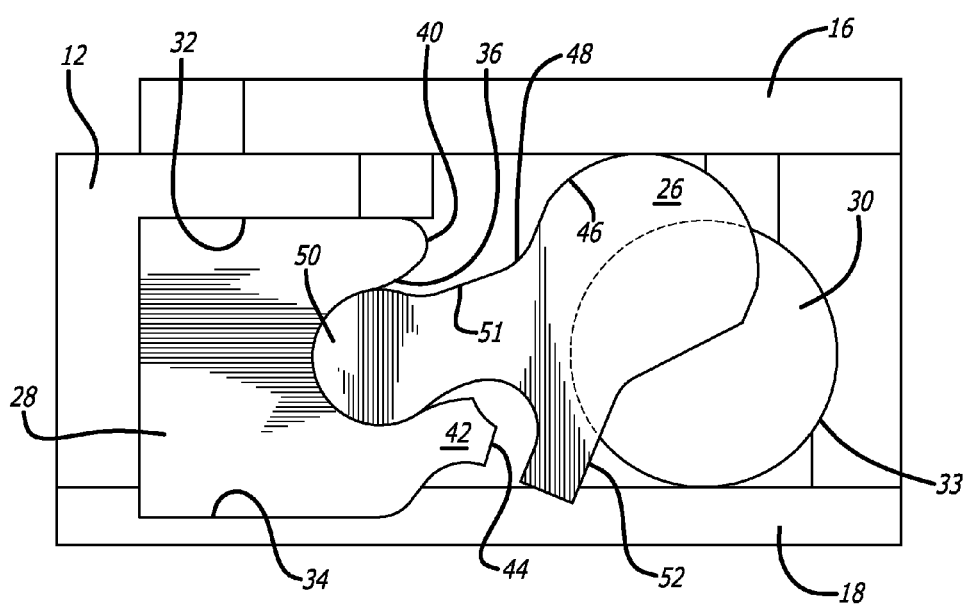
FIG. 6 is an enlarged, cross-sectional view of the contact between the integrated circuit and the connector link.
Figure 7:
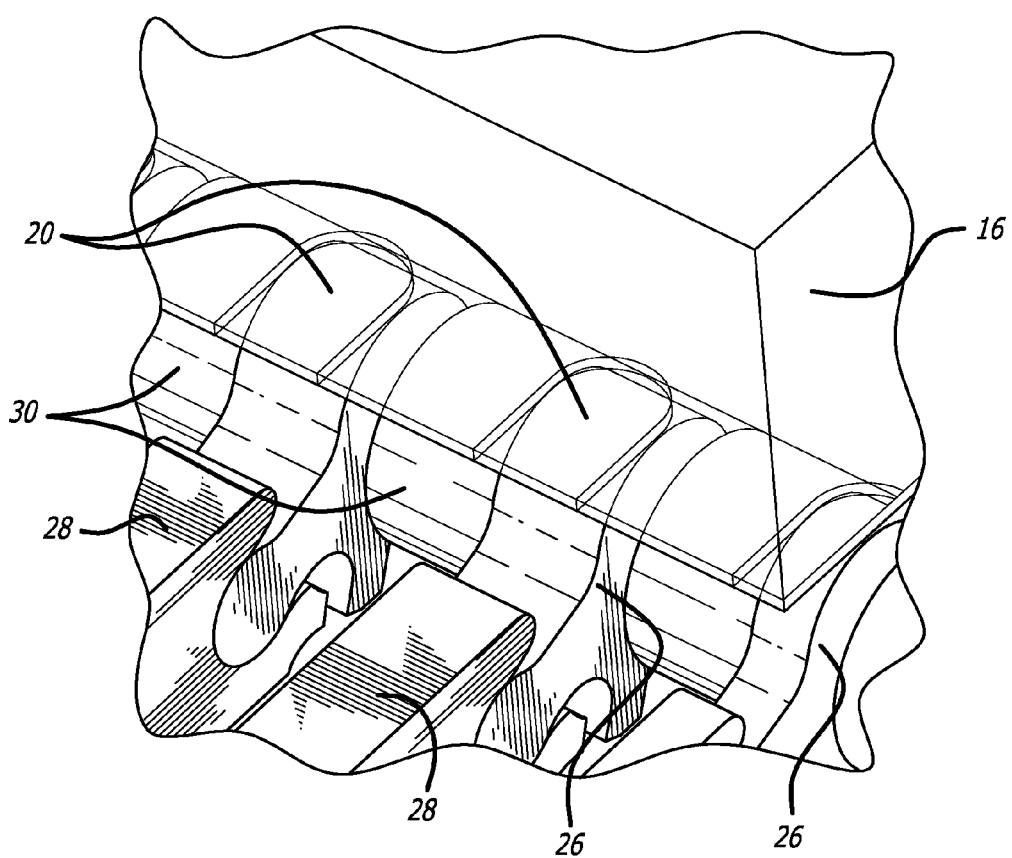
FIG. 7 is an elevated view of the connection between the PCB and the connectors under the influence of the elastomer member.

FIG. 6 represents the condition of the connector 22 after the IC 16 has been placed on the platform. The connector 22 that establishes an electrical connection is a two piece assembly having a link member 26 and a mount element 28. A resilient tubular member 30 is housed in the cylindrical capture groove 33 (see also FIG. 2), and serves to bias the connector 22 in the disengaged position. The groove 33 roughly matches the contour of the elastomer member 30 and holds it in place. This allows the elastomer to be embedded in the socket, and provides more evenly applied pressure in a greater range of surface area of the elastomer 30. By contouring the groove to the contour of the elastomer profile, misalignment is avoided and consistent and reliable pressure is applied by the elastomer to the link 26.

The mount 28 is retained in the platform 12 and includes a generally planar upper surface 32 and a generally planar lower surface 34. In a preferred embodiment, the platform 12 is sized to compress the mount 28 slightly so that it extends into and slightly embeds the test equipment contact surface 18. Between the lower and upper surfaces is a laterally opening cavity 36 having a slightly upwardly tilted orientation. The cavity 36 is substantially circular up to a mouth, which then gradually widens toward the link 26, and the cavity is approximately sized to retain a portion of the link member therein. The upper edge of the mouth 38 transitions to the upper surface 32 through a curved finger-like projection 40. Similarly, the lower edge of the mouth 38 transitions to the lower surface 34 through a projecting lip member 42. The lip member 42 has a lower edge that curves upward to a front edge 44.

The link 26 has three main components. The first component is an arcuate contact surface 46 along the upper edge that is shaped to permit rolling contact with the IC above as the IC applies a downward force on the link 26, causing the link 26 to pivot about the mount 28. The second component of the link 26 is a rocker arm 48 having a neck portion 51 that terminates in a bulb-shaped distal tip 50. The cavity 36 of the mount 28 and the bulb-shaped distal tip of the rocker arm 48 are complimentary sized to allow smoothing pivoting of the rocker arm within the cavity of the mount in a controlled manner without undue wobble. The tubular member 30 is resilient and, seated in the circular capture groove 33, biases the arcuate surface clockwise (upward) so as to project through the slot 24 of the platform 12. With the link rotated in the position, a leg member 52 is rotated out of contact with the test equipment 18. This is the disengaged position (not shown), or stand-by position as the connection assembly is ready for the presence of the IC chip.

As seen in FIGS. 3 and 5 through 7, when the IC 16 is brought to bear against the platform 12, the lower surface 17 of the IC 16 contacts the protruding arcuate surface 46 of the link 26 and pushes the link down against the bias of the resilient tubular member 30. This downward force brought to bear by the IC 16 rotates the link counterclockwise against the bias of the resilient member 30, as the link 26 pivots about the mount via the rocker arm 48. This rotation of the link 26 continues until the leg member 52 makes solid contact with the test equipment 18. Further downward force only increases the pressure applied by the rocker arm 48 at the cavity 36 of the mount 28 to bolster the reliability of the contact. This is the engaged position, as there is a direct flow path between the contact pad 20 of the IC 16, through the arcuate contact surface 48 of the link 26 and through the rocker arm 48 to the mount 28, which is embedded on and affixed to a lead (not shown) of the load board/test equipment 18. The flow path being established, signals can then be processed by the test equipment from the IC in the conventional manner. It should be noted that there is no deformation of any component of the connector assembly, and therefore no part of the connector assembly can lose its resiliency and have the contact pressure diminish over time.

Figure 2:
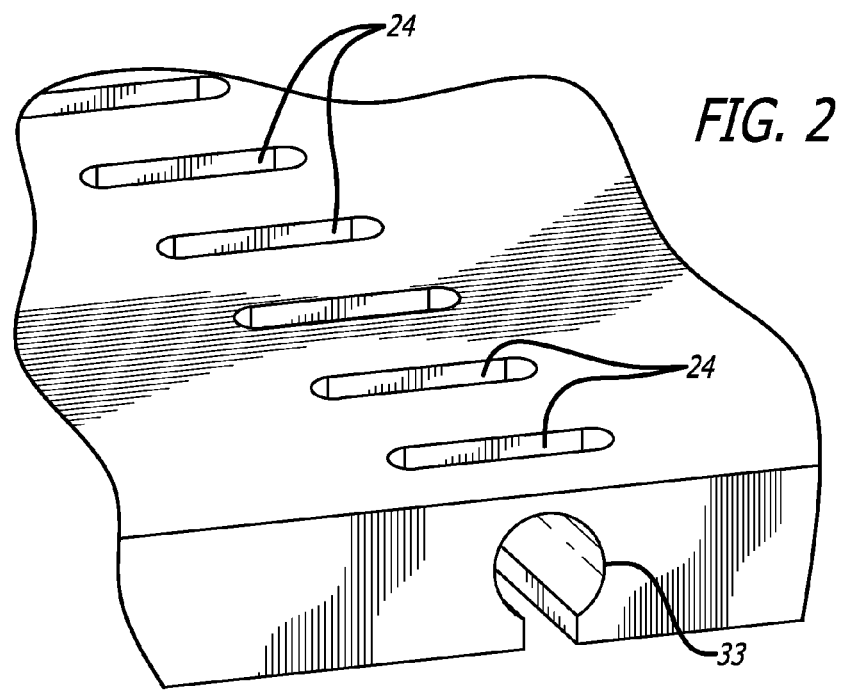
FIG. 2 is an elevated, perspective view of the socket and cylindrical capture groove.
Figure 3:
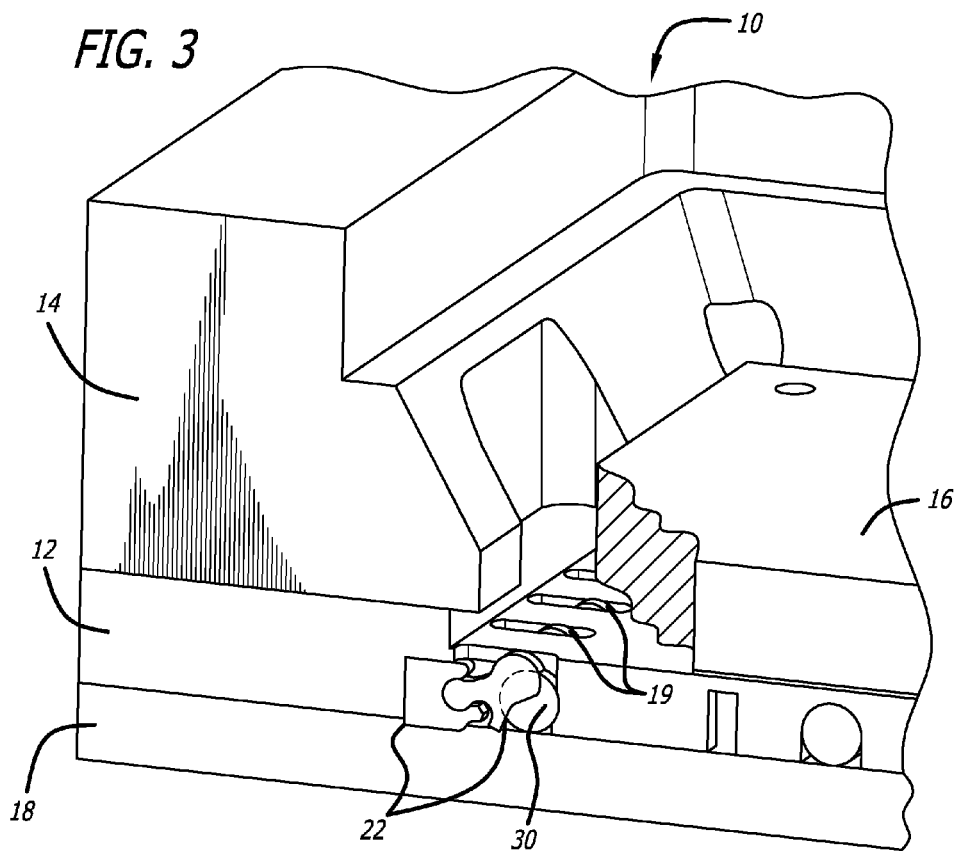
FIG. 3 is an enlarged, elevated cut-away view of a portion of a test socket illustrating the connector and cylindrical capture groove.
Figure 4:
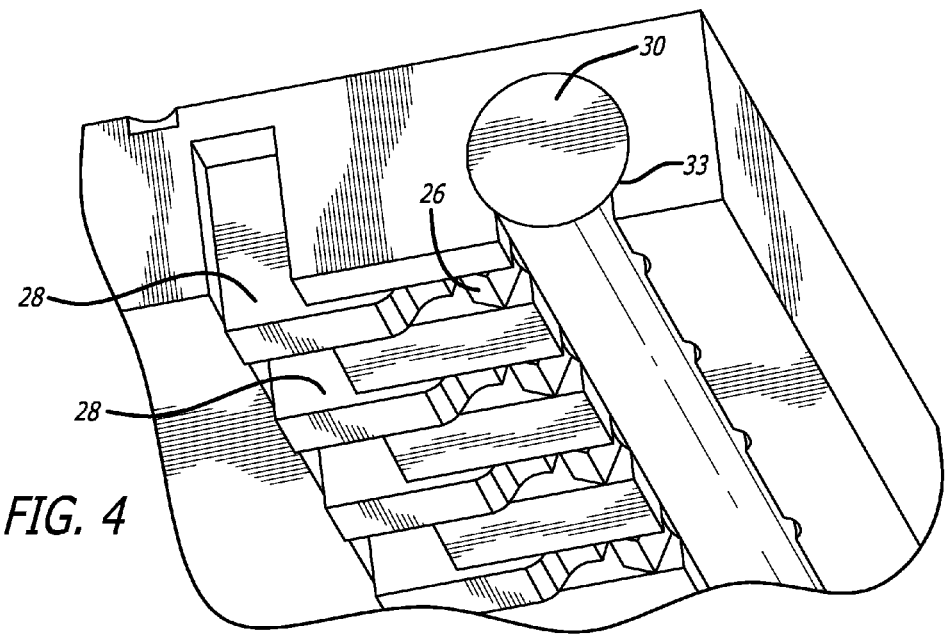
FIG. 4 is below view of the socket showing the elastomer member and circular capture groove.
Figure 5:
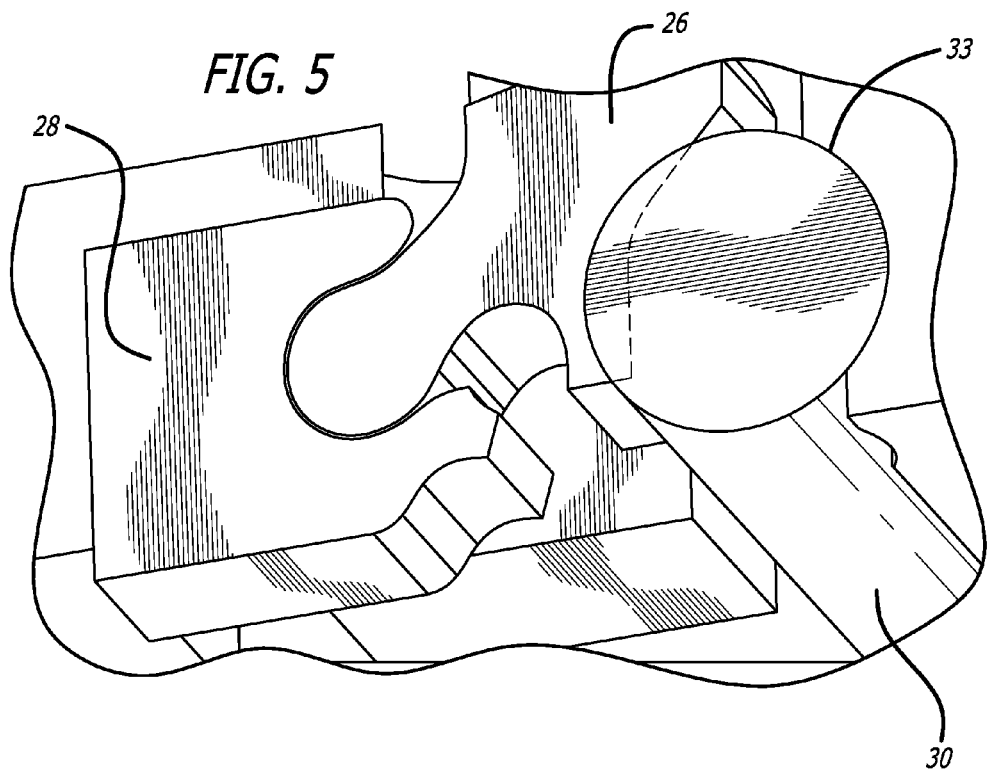
FIG. 5 is an enlarged, perspective view of the link and mount in the engaged position.

FIG. 4 illustrates the capture groove 33 as it surrounds and embeds the cylindrical elastomer member 30. As can be seen in FIGS. 2 and 4, the groove 33 is circular and in profile and cylindrical in shape and matches the contour of the elastomer member 30. When the socket is placed on the test equipment 18, the elastomer member 30 is locked in place and cannot move or twist out of position. In a first preferred embodiment, the semi-circular profile is approximately 270 degrees of arc, and is at least greater than 180 degrees of arc in a second preferred embodiment. In other embodiments, the capture groove 33 is of a different shape, but still abides by the contour of the resilient elastomer member 30. The groove 33 improves contact with the links 26,28, and also facilitates assembly and maintenance as the socket can be handled without having the elastomer member become dislodged or fall out.

The capture groove 33 is formed in the socket using a special drill that creates a circular cross section. The drill is sized to match the diameter of the elastomer member so that there is a snug, if not press, fit. The groove is cut across the width of the socket in a preferred embodiment, although the opening of the groove may be intermittent and the elastomer member "weaved" into the groove 33.

It will be understood that this disclosure is merely illustrative, and that it is to be further understood that changes may be made in the details, particularly in matters of shape, size, material, and arrangement of parts without exceeding the scope of the invention. Accordingly, the scope of the invention is as defined in the language of the appended claims, and is not limited in any manner by the aforementioned descriptions and drawings.

We claim:

1. An improved socket for electrically coupling an integrated circuit (IC) to a board so that a signal may be transmitted thereto, comprising:
   a platform for receiving the integrated circuit thereon;
   an elongate resilient tubular member housed in the platform; and
   a plurality of two-piece connector assemblies, each connector assembly comprising a mount and an associated link pivotable about the mount, each connector assembly having first and second positions, the first position comprising an engaged position wherein an electrical contact is established between the integrated circuit and the board, and a standby position where the link does not establish an electrical contact between the integrated circuit and the board;
   wherein the mounts are retained in the platform and comprise a curved cavity on a lateral side opposite an associated link member; and
   wherein the associated link member has an arcuate contact surface on an upper side adapted for rolling contact with the integrated circuit, a rocker arm laterally displaced with a bulb-shaped tip seated in the curved cavity of the mount, the link vertically pivotable about bulb tip, and a downwardly sloping leg member wherein the elongate resilient tubular member biases the connector assemblies in the standby position; and wherein the socket includes a groove for receiving the elongate resilient member, the groove having a profile that substantially coincides with a profile of the elongate resilient member.

2. The socket of claim 1, wherein the profile of the groove is semi-circular.

3. The socket of claim 2 wherein the profile of the groove includes an arc of greater than one hundred eighty degrees.

4. The socket of claim 2 wherein the profile of the groove includes an arc of at least two hundred and seventy degrees.

* * * * *